US008893923B2

(12) United States Patent
Kahlon et al.

(10) Patent No.: US 8,893,923 B2
(45) Date of Patent: Nov. 25, 2014

(54) METHODS AND SYSTEMS FOR DISPENSING DIFFERENT LIQUIDS FOR HIGH PRODUCTIVITY COMBINATORIAL PROCESSING

(71) Applicant: Intermolecular, Inc., San Jose, CA (US)

(72) Inventors: Satbir Kahlon, Livermore, CA (US); Aaron T. Francis, San Jose, CA (US); Chi-I Lang, Cupertino, CA (US); Gregory P. Lim, Fremont, CA (US); Jeffrey Chih-Hou Lowe, Cupertino, CA (US); Robert Anthony Sculac, Lake Oswego, OR (US)

(73) Assignee: Intermolecular, Inc., San Jose, CA (US)

( * ) Notice: Subject to any disclaimer, the term of this patent is extended or adjusted under 35 U.S.C. 154(b) by 126 days.

(21) Appl. No.: 13/687,906

(22) Filed: Nov. 28, 2012

(65) Prior Publication Data

US 2014/0144512 A1 May 29, 2014

(51) Int. Cl.
*B67B 7/00* (2006.01)
*H01L 21/00* (2006.01)

(52) U.S. Cl.
CPC .................................... *H01L 21/00* (2013.01)
USPC ............ 222/1; 222/129; 222/132; 222/144.5; 222/145.2; 137/15.05; 137/597; 137/599.03

(58) Field of Classification Search
USPC ............... 222/1, 108, 129, 132, 144.5, 145.1, 222/145.2, 145.7, 443; 137/1, 15.05, 597, 137/599.03
See application file for complete search history.

(56) References Cited

U.S. PATENT DOCUMENTS 3,692,048 A 9/1972 Uchida
5,258,921 A 11/1993 Ellis
5,568,882 A 10/1996 Takacs
6,116,184 A 9/2000 Solayappan et al.
6,368,562 B1 4/2002 Yao
6,376,014 B1 4/2002 Mihalcheon
6,521,187 B1 2/2003 Papen
6,557,582 B2 * 5/2003 Krog ........................ 137/599.03
6,689,215 B2 2/2004 Nguyen
6,758,231 B1 * 7/2004 Lochtefeld et al. ............... 137/1
6,848,391 B1 2/2005 Allen
6,901,956 B2 * 6/2005 Krog ........................ 137/599.03
6,902,704 B2 6/2005 Wilson
6,997,053 B2 2/2006 Forshey et al.
7,044,147 B2 * 5/2006 Enicks et al. ..................... 137/1

(Continued)

FOREIGN PATENT DOCUMENTS

WO WO2007063112 A 6/2007

*Primary Examiner* — Kevin P Shaver
*Assistant Examiner* — Nicholas J Weiss

(57) ABSTRACT

Provided are methods and systems for dispensing different chemicals used for high productivity combinatorial processing. A dispense panel may include multiple inlet lines for supplying different chemicals. Each inlet line is connected to its own three-way valve that either allows the supplied chemical to flow from the inlet line towards a dispense valve connected to a dispense manifold (during dispensing of the supplied chemical) or allows another chemical to flow from the dispense valve to a waste manifold (during priming of the dispense manifold with this other chemical). Specifically, during priming a chemical supplied from its inlet line and is passed through a corresponding three-way valve and is directed to its dispense valve and then into the dispense manifold. Other dispense valves and three-way valves of the dispense panel allow this chemical to flow out of the dispense manifold, thereby priming remaining parts of the panel.

19 Claims, 10 Drawing Sheets

700
708a 710a 704 716a
Chemical A
706a
702
708b 710b 716b
Chemical B
706b
708c 710c 716c
Chemical C
706c

(56) References Cited

U.S. PATENT DOCUMENTS

| | | | | |
|---|---|---|---|---|
| 7,074,274 | B1 | 7/2006 | Shutic | |
| 7,318,372 | B2 | 1/2008 | Cooke | |
| 7,540,298 | B2 * | 6/2009 | Enicks et al. | 137/1 |
| 7,846,497 | B2 * | 12/2010 | Gold et al. | 427/248.1 |
| 8,011,317 | B2 * | 9/2011 | Weiner et al. | 118/407 |
| 8,220,502 | B1 | 7/2012 | Kelekar | |
| 8,234,012 | B1 | 7/2012 | Kelekar | |
| 8,733,592 | B2 * | 5/2014 | Kitano et al. | 222/64 |
| 2003/0032198 | A1 | 2/2003 | Lugmair et al. | |
| 2006/0240545 | A1 | 10/2006 | Tomida et al. | |
| 2009/0308484 | A1 | 12/2009 | Nakagawa | |
| 2011/0146807 | A1 * | 6/2011 | Bassmann et al. | 137/15.05 |
| 2012/0111413 | A1 * | 5/2012 | Kandiyeli et al. | 137/1 |
| 2012/0148742 | A1 | 6/2012 | Kelekar | |
| 2013/0333768 | A1 * | 12/2013 | Chandrasekharan et al. | 137/238 |

* cited by examiner

METHODS AND SYSTEMS FOR DISPENSING DIFFERENT LIQUIDS FOR HIGH PRODUCTIVITY COMBINATORIAL PROCESSING

TECHNICAL FIELD

The present invention relates generally to semiconductor processing and more specifically to methods and systems for dispensing different liquids for High Productivity Combinatorial™ (HPC™) (High Productivity Combinatorial™ and HPC™ are trademarks of Intermolecular, Inc.).

BACKGROUND

To achieve the desired performance enhancement for each successive generation of integrated circuits (ICs), semiconductor manufacturing has become increasingly reliant on new materials and their integration into advanced process sequences. Unfortunately, typical semiconductor manufacturing equipment is not well suited for materials exploration and integration. Issues impacting the use of typical semiconductor manufacturing equipment include difficulty in changing process materials and chemicals rapidly, limited ability to integrate and sequence multiple materials or chemicals in a single reactor or process chamber, high equipment cost, large sample size (300 mm wafer) and inflexible process/reactor configurations. Traditional manufacturing tools need to be complimented with equipment that facilitates fast testing of new materials and materials processing sequences over a wide range of process conditions.

SUMMARY

Provided are methods and systems for dispensing different chemicals used for high productivity combinatorial processing. A dispense panel may include multiple inlet lines for supplying different chemicals. Each inlet line is connected to its own three-way valve that either allows the supplied chemical to flow from the inlet line towards a dispense valve connected to a dispense manifold (during dispensing of the supplied chemical) or allows another chemical to flow from the dispense valve to a waste manifold (during priming of the dispense manifold with this other chemical). Specifically, during priming a chemical supplied from its inlet line and is passed through a corresponding three-way valve and is directed to its dispense valve and then into the dispense manifold. Other dispense valves and three-way valves of the dispense panel allow this chemical to flow out of the dispense manifold, thereby priming remaining parts of the panel.

In some embodiments, a method of dispensing different chemicals for use in high productivity combinatorial processing involves providing a dispense panel including a dispense manifold, a first dispense valve connected to the dispense manifold, and a second dispense valve connected to the dispense manifold. The method then proceeds with priming the dispense panel with a first chemical such that the first chemical is flown through the first dispense valve to the dispense manifold. The priming also involves flowing the first chemical through the second dispense valve from the dispense manifold. After the priming, the dispense manifold is completely filled with the first chemical. The method may then proceed with dispensing the first chemical from the dispense manifold. The dispensing involves flowing the first chemical through the first dispense valve to the dispensing manifold. Furthermore, during the dispensing, the second dispense valve is kept closed during the dispensing such that the first chemical does not flow through the second dispense valve.

In some embodiments, the dispense panel also includes a waste manifold for receiving the first chemical from the second dispense valve during the priming the dispense panel with the first chemical. The dispense panel may also include a first three-way valve and a second three-way valve. The first three-way valve may be connected to the first inlet, the first dispense valve, and the waste manifold and may be configured to allow a flow either between the first inlet and the first dispense valve or between the first dispense valve and the waste manifold. The second three-way valve may be connected to a second inlet, the second dispense valve, and the waste manifold and may be configured to allow a flow either between the second inlet and the second dispense valve or between the waste manifold and the second dispense valve. In some embodiments, during the priming the dispense panel with the first chemical, the first three-way valve allows the first chemical to flow from the first inlet to the first dispense valve, while the second three-way allows the first chemical to flow from the second dispense valve into the waste manifold. Furthermore, during the dispensing the first chemical from the dispense manifold, the first three-way valve may allow the first chemical to flow from the first inlet to the first dispense valve, while the second three-way valve is kept closed such that the first chemical does not flow through.

In some embodiments, the method also involves priming the dispense panel with a second chemical and dispensing the second chemical from the dispense manifold. The priming involves flowing the second chemical through the second dispense valve to the dispense manifold and flowing the second chemical through the first dispense valve from the dispense manifold. After this priming operation, the dispense manifold is completely filled with the second chemical and free from the first chemical, which was dispense earlier from the same dispense manifold. Dispensing the second chemical from the dispense manifold may involve flowing the second chemical through the second dispense valve to the dispensing manifold, while the first dispense valve is kept closed during the dispensing such that the second chemical does not flow through the first dispense valve at that time.

In some embodiments, during the priming the dispense panel with the second chemical, the second three-way valve allows the second chemical to flow from the second inlet to the second dispense valve, while the first three-way allows the second chemical to flow from the first dispense valve into the waste manifold. Furthermore, during the dispensing the second chemical from the dispense manifold, the second three-way valve may allow the second chemical to flow from the second inlet to the second dispense valve, while the second chemical may not flow through the first three-way valve. In some embodiments, the method involves continuing with priming the dispense panel with the first chemical and dispensing the first chemical from the dispense manifold after completing dispense of the second chemical from the dispense manifold. Overall, priming and dispensing operations may be repeated using any new of different chemicals. Dispensing of the same chemical may be repeated without a need for another priming operation in some embodiments.

In some embodiments, the dispense panel also includes a third dispense valve connected to the dispense manifold. In this situation, priming the dispense panel with the first chemical involves flowing the first chemical through the third dispense valve from the dispense manifold. However, the third dispense valve is kept closed during the dispensing the first chemical from the dispensing manifold such that the first chemical does not flow through the third dispense valve.

During priming the dispense panel with a second chemical, the second chemical is flown through the second dispense valve to the dispense manifold, through the first dispense valve from the dispense manifold, and through the third dispense valve from the dispense manifold. After the priming operation, the dispense manifold is completely filled with the second chemical. Dispensing of the second chemical involves flowing the second chemical through the second dispense valve to the dispensing manifold, while the first dispense valve and the third dispense valve are kept closed during the dispensing such that the second chemical does not flow through the first dispense valve and the third dispense valve.

In some embodiments, the method involves priming the dispense panel with a third chemical. This priming operation involves flowing the third chemical through the third dispense valve to the dispense manifold, flowing the third chemical through the first dispense valve from the dispense manifold, and flowing the third chemical through the second dispense valve from the dispense manifold. After the priming operation, the dispense manifold is completely filled with the third chemical. The method then proceed with dispensing the third chemical from the dispense manifold. The dispensing operation involves flowing the third chemical through the third dispense valve to the dispensing manifold, while the first dispense valve and the second dispense valve are kept closed during the dispensing such that the third chemical does not flow through the first dispense valve and the second dispense valve.

One or more chemicals used for priming and then dispensing may be inert gases, deionized water, or processing chemicals. In some embodiments, the first dispense valve is shut for a period of time priming the dispense panel with the first chemical and dispensing the first chemical from the dispense manifold. Alternatively, the first dispense valve may remain open. These approaches also apply to other dispense valves, e.g., to the second dispense valve for period between priming the dispense panel with the second chemical and dispensing the second chemical from the dispense manifold. Typically, after the priming, the dispense manifold does not include any other previously dispensed chemicals. For example, if the dispense manifold was used to dispense the first chemical and then it was primed with the second chemical, then the dispense manifold may be substantially free from the first chemical. For purposes of this disclosure, substantially free means a volume concentration of less than 1%.

Provided also is a dispense panel for dispensing different chemicals for use in high productivity combinatorial processing. The dispense panel includes a dispense manifold, a waste manifold, a first inlet line connected to a supply of a first chemical, and a second inlet line connected to a supply of a second chemical. The dispense panel also includes a first dispense valve connected to the dispense manifold and configured to control a flow in and out of the dispense manifold and a second dispense valve connected to the dispense manifold and configured to control a flow in and out of the dispense manifold. The dispense panel includes a first three-way valve provided between the first inlet and a combination of the first dispense valve and the waste manifold and configured to allow a flow either between the first inlet and the first dispense valve or between the waste manifold and the first dispense valve. The dispense panel also includes a second three-way valve provided between the second inlet and a combination of the second dispense valve and the waste manifold and configured to allow a flow either between the second inlet and the second dispense valve or between the waste manifold and the second dispense valve.

BRIEF DESCRIPTION OF THE DRAWINGS

So that the above recited features of the present invention can be understood in detail, a more particular description of the invention, briefly summarized above, is provided with reference to embodiments, some of which are illustrated in the appended drawings. It is to be noted, however, that the appended drawings illustrate only typical embodiments of this invention and are therefore not to be considered limiting of its scope, for the invention may include other equally effective embodiments.

DETAILED DESCRIPTION

Figure 1:
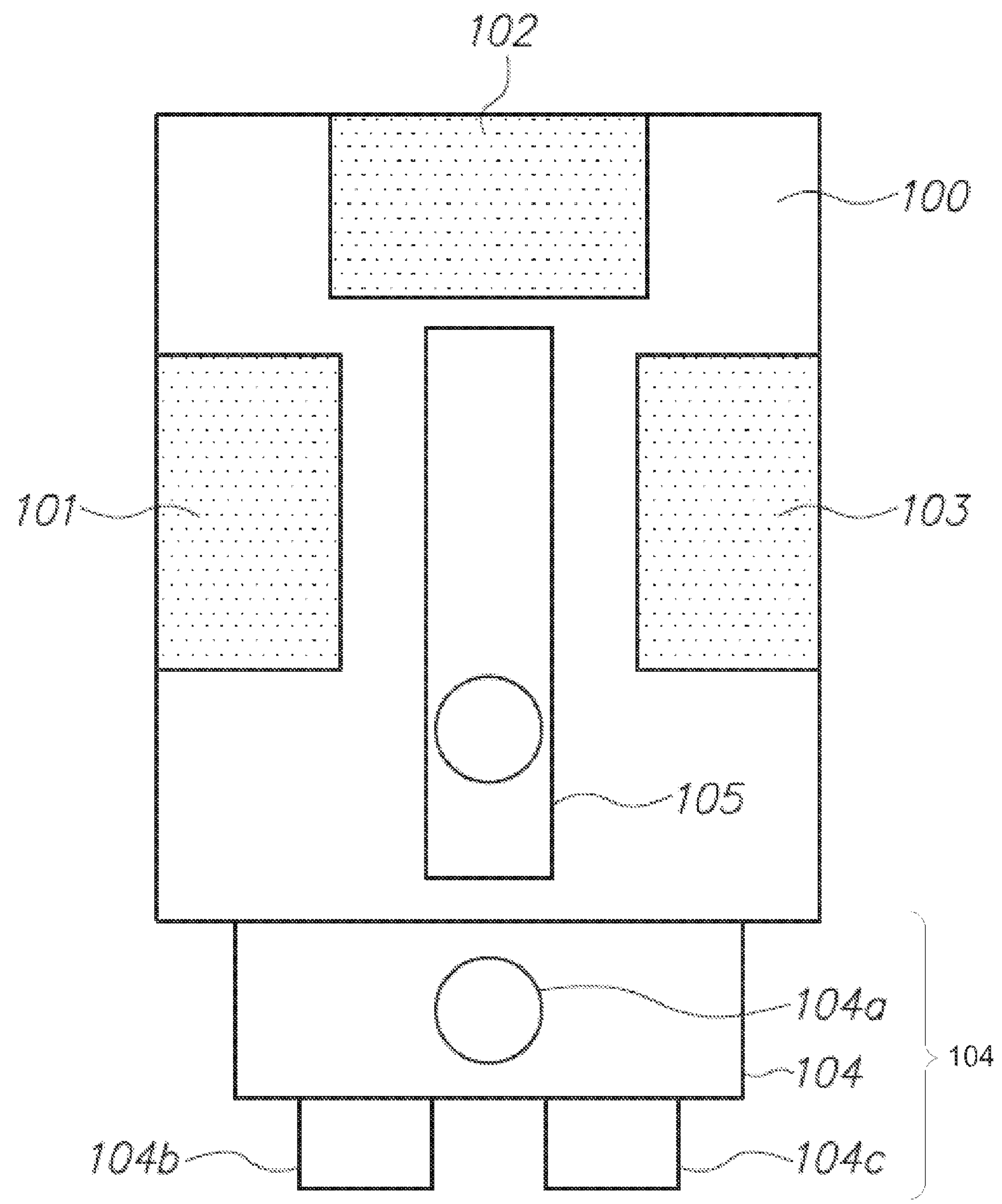
FIG. 1 is a substrate processing system (SPS), in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

High productivity combinatorial (HPC) systems utilize many different chemicals that needs to be supplied in a controlled manner, e.g., in accurate doses and without cross-contamination. Furthermore, these chemicals need to be supplied in a fast, reliable, and often repeatable manner. A system supplying these chemicals should be easily cleaned.

Dispensing an accurate dose may involve pre-filling and priming lines and valves used to supply this dose. Any gas bubbles or foreign chemicals that may be present in the lines or valves can cause deviations in the dispensed doses even though these bubbles and foreign chemicals may not necessarily be directly on a flow path. Traps and dead ends that are common in many conventional dispense systems may divert a portion of the dose (that would have otherwise be dispensed) or release other chemicals previously diverted into these areas. The same issues may also cause contamination of dispensed liquids.

Provided are methods and systems for dispensing different chemicals for high productivity combinatorial processing. The chemicals are dispensed with little risk of cross-contamination and with high accuracy. The dispensing accuracy could be within 5% and, in some embodiments, within 1%. To achieve that, a dispense manifold is primed with a chemical to be dispensed from the manifold prior to the dispensing operation. For purposes of this disclosure, priming is defined as flowing a chemical through the entire dispense manifold and completely filling the manifold with the chemical. It should be noted that portions of the manifold may overlap with valves, e.g., dispense valves. The entire inside volume of the dispense manifold and often other components are subjected to the flow of the chemical during priming. This flow removes most of the gas bubbles and other chemicals (e.g., left inside the dispense manifold after previous dispense operations). The volume of the chemical used for priming exceeds the inside volume of the manifold. A typical volumetric ratio of chemicals used for priming to the inside volume of the manifold is between 1 and 10 or, more specifically, between 2 and 5. The excess of the chemical is discarded into a waste manifold.

Specifically, a dispense panel used for dispensing may include multiple inlet lines for supplying different chemicals into the same dispense manifold. The dispense manifold dispenses chemicals from the dispense panel, e.g., into other components of an HPC system. In some embodiments, one HPC system may include multiple dispense panels. Furthermore, one dispense panel may include multiple dispense manifolds. The following description refers to a portion of the dispense panel that includes one dispense manifold. A number of inlet lines connected to the same manifold may be between about 2 and 30 or, more specifically, between about 5 and 10, such as 7. Each inlet line may be used to deliver different chemicals. In some embodiments, the same line may be shared to deliver different chemicals, such as rinse liquids (e.g., DI water) and/or inert gases (e.g., nitrogen, argon). For purposes of this disclosure, any material delivered into the dispensing manifold is referred to as a chemical. These chemicals may be either in a liquid phase, gas phase, or a combination of two phases. The chemicals may or may not be dispensed from the dispense module. For example, some chemicals may be used for cleaning of the dispense panel and are not delivered downstream in the HPC system. Once passed through the dispense manifold, these cleaning chemicals may be discarded through the waste manifold. Some chemicals may be used for HPC processing, which is further described below.

Each inlet line is connected to a source of a chemical, which may be a utility line, a bottle, or some other container holding the chemical. The chemical may be delivered into the dispense panel through the corresponding inlet line by maintaining a pressure differential or other means. During dispensing and priming operations further described below, each inlet line continues to be exposed to one chemical. If this chemical is dispensed or used for priming, this inlet line supplies the chemical into the dispense panel. Otherwise, the inlet line may be shut off.

Specifically, each inlet line is connected to a three-way valve that either allows a flow from the inlet line and to a dispense valve connected to the dispense manifold or allows a flow between that dispense valve and the waste manifold. These positions of the three-way valve may be defined as a priming position, in which the valve allows the flow between the dispense valve and the waste manifold, and a supplying position, in which the valve allows the flow from the inlet line and to the dispense valve. It should be noted that the dispense valve is operated independently from the corresponding three-way valve and it may or may not allow the flow into the dispense manifold. For example, during a priming operation, all dispense valves may be opened, while only one three valve may be in its supplying position. All other three-way valves may be in their priming positions. The three-way valve that is in the supplying position is attached to the inlet line providing the priming chemical. During a supplying operation, only one dispense valve is open, while all other dispense valves are closed. The open dispense valve receives the dispensed chemical from a three-way valve that is in its supplying position. All other three-way valves could be in any position, e.g., in their priming positions or in their supplying positions.

These valve positions could be further described with reference to an illustrative sequence of operations. Prior to dispensing a chemical from the dispense panel, the panel is first primed with this chemical, which means that the entire dispense manifold is filled with this chemical. Prior to priming, the dispensed manifold may filled with some other chemical, which in certain embodiments may be an inert gas or ambient air. During priming, the chemical is supplied from one of the inlet lines and is passed through a corresponding three-way valve that is in its supply position. In this position, the chemical is directed towards a corresponding dispense valve, which is open allowing the chemical into the dispense manifold. Once the chemical fills the dispense manifold and reaches other dispense valves, it passes through the other dispense valves that are kept open. These other dispense valves allow the chemical to proceed to corresponding three-way valves that are in their priming positions, thereby diverting each flow into the waste manifold. The chemical may be allowed to flow through the dispense manifold for a period of time and continued to be discarded through these other dispense valves and three-ways valves into the waste manifold. This ensures that air bubbles and other chemicals are removed from the dispense manifold. At the end of the priming operation, the dispense manifold is completely filled with the first chemical.

After priming is completed, all dispense valves may be closed. In some embodiments, the dispense valve that supplies the chemical into the dispense manifold (and that corresponds to the three-way valve in the supplying position) may be kept open. Alternatively, this dispense valve may be closed. In some embodiments, positions of all three-way valves remain the same while switching from the priming operation and into the dispensing operation.

During the dispensing operation, the inlet, which supplied the chemical during the priming operation, also supplies the same chemical through the three-way valve kept in the supplying position and the corresponding dispense valve. All other dispense valves are closed and the chemical is not allowed to flow from the dispense manifold through any other dispense valves. This is the main difference between the priming operation and the dispensing operation. As such, the dispensed amount is precisely controlled by the only open dispense valve. It should be noted that after the priming operation, the dispense manifold and the path between the inlet supplying the chemical and the dispense manifold is completely filled within this chemical and is substantially free of other chemicals (e.g., less than 1% by volume of other chemicals may be present in these portions of the dispense panel).

When switching to another chemical, the process is repeated using another set of three-way valve and dispense valve in a similar manner as further described below. The initially used chemical is removed from the dispense manifold and a path between a new inlet line supplying a new chemical and the dispense manifold.

A quick recap of the flows through the dispense valves may help to better understand the priming and dispensing operations. During a priming with a first chemical supplied from a first inlet line that is connected to a first dispense valve by a three-way valve, the first chemical flows through the first dispense valve in a direction to the dispense manifold. This direction may be referred to as a supplying direction. During the same operation, the first chemical flows through all other dispense valves attached to the same dispense manifold in a direction away from the dispense manifold. This direction may be referred to as a priming direction. It should be noted that these other dispense valves may be primed all at the same time, one at the time, or in various groups. During the supplying operation, there is no flow through these other dispense valves, while the flow through the first valve is still in the supplying direction. While another chemical is supplied through another inlet valve, the flow through the first dispense valve is in an opposite (i.e., priming) direction during the priming operation and then the first valve is closed during the dispensing operation.

HPC Methodology and Multiple Channel Site-Isolated Reactors

An integrated processing tool, referred to herein as a multiple channel site-isolated reactor (MCSIR), is described below. The MCSIR includes a full-wafer processing module and a combinatorial site-isolated processing module. The integrated processing tool may be used for mixed-mode processing between full-substrate and multiple site-isolated regions of the full substrate. As such, chemicals for use in the processing modules are fed from a common delivery system that includes a set of manifolds that generate multiple solutions having variable compositions. More specifically, composition of these solutions can be varied in a combinatorial manner. These different compositions may be formed from a set of constituents, delivery of which is controlled by the systems and specified in recopies provided into the system. To allow thorough solution mixing as well as accurate temperature and pH control, the output of each first manifold is coupled to mixing vessels. The output of each mixing vessel is subsequently dispensed to one or more of a set of second manifolds, which deliver a solution from this mixing vessel to one or more reactors of the processing modules. In addition to providing solutions that are mixed statically in mixing vessels, the second set of manifolds allows multiple chemicals to be distributed simultaneously to facilitate dynamic, in-line mixing of solutions.

The MCSIR may integrate multiple independently-controlled process chambers, each representing an independent site isolation region of the full substrate. The MCSIR allows mixing and dispensing different chemical solutions (e.g., multiple solutions having different composition) onto the same substrate simultaneously and/or in sequence. Furthermore, the MCSIR allows independently varying flow and/or solution composition to any number of reactors or one or more subsets of reactors. The MCSIR provides the ability to synchronize process steps and control critical timing across all site-isolated reactors when a global parameter for the process sequence requires this type of synchronization for non-site-isolated control parameters (e.g., temperature of the wafer substrate, reactor height/volume, and the like).

By providing multiple independently controlled and plumbed reactors or process chambers across a single substrate (e.g., 200-, 300-, or 450-mm silicon substrate), the MCSIR described herein addresses the issues that cause traditional semiconductor manufacturing equipment to not be well suited for materials exploration and integration. The configuration and flow dynamics of each site-isolated reactor is typically scaled from a production reactor, facilitating process scale-up to full wafers with minimal changes to the process integration sequence. In addition, materials delivery systems of the MCSIR are configured to allow greater flexibility in both the number of materials that are provided to the chamber as well as the steps in process sequence that are utilized to effect the materials integration. Reactor miniaturization and relaxed equipment requirements for materials research and integration also reduces the cost of the equipment compared to production tools.

Systems and methods for processing a substrate (e.g., forming material(s) on a substrate) are described below. The systems and methods for processing substrates, collectively referred to herein as "substrate processing systems" (SPSs), include combinatorial processing, combinatorial process sequences integrated with conventional substrate processing, and/or site-isolated processing, as described in detail below. The SPS of an embodiment enables production of very small structures and features on substrates (e.g., at the nanometer size scale) at very low cost, which can be useful in the commercial manufacturing of a variety of products, such as electronic components and flat panel displays to name a few. The various systems and methods described below are presented as examples only and are not intended to limit the systems and methods described and claimed herein to particular combinations of combinatorial processing, combinatorial process sequences integrated with conventional substrate processing, and/or site-isolated processing. Furthermore, the systems and methods described below are not limited to particular processes (e.g., wet processes, dry processes, etc.).

In the following description, numerous specific details are introduced to provide a thorough understanding of, and enabling description for, embodiments of the SPS. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

The SPS may include at least one interface configured to receive at least one substrate. The SPS may also include a number of modules coupled to the interface. The modules, also referred to herein as components, include a pre-processing module, a processing module, and a post-processing module, but may include any number and/or type of other modules where any of the modules may include functions of the pre-processing, processing, and/or post-processing modules. The SPS is not required to include at least one of each of any particular module type. Also, functions of all of the pre-processing, processing, and post-processing modules may be embedded within a single module. Each module of the multiple modules can contain at least one of a number of different processes as appropriate to processes contained in at least one other of the modules. The SPS also includes at least one handler coupled to the interface and configured to move the substrate between the interface and one or more of the modules.

FIG. 1 is an SPS 100, in accordance with some embodiments. SPS 100 includes a pre-processing module 101, a processing module 102, and a post-processing module 103. SPS 100 is not required to include at least one of each of the preceding module types. For example, a particular process flow may include only processing module 102 and features for moving a substrate into and out of SPS 100. Also, functions of all of the pre-processing, processing, and post-processing modules may be provided within a single module. Processing modules 101, 102 and 103 can each be implemented using an apparatus (in particular, conventional commercial substrate processing apparatus) as appropriate to the types of substrate processing for which the modules 101, 102 and 103 are to be used. Processing modules 101, 102, and 103 can be implemented with modification(s) and/or addition(s) depending on the particular characteristics of the substrate and/or processes.

Substrates enter and leave SPS 100 via a system interface 104, which may be also referred to as a factory interface. A single substrate can be processed at one time in SPS 100 or multiple substrates can be processed at one time in a batch. The system interface 104 includes a substrate handler 104*a*, which can be implemented, for example, using a robot. The substrate handler 104*a* moves substrate(s) into and out of SPS 100. To facilitate moving the substrates into and out of SPS 100, system interface 104 also includes a substrate load station 104*b* and a substrate unloading station 104*c*. These stations may be also referred to as a Front Opening Unified Pod (FOUP) load station and a FOUP unload station, respectively.

After substrate(s) that have been processed are removed from SPS 100 and placed on the substrate unload station 104*c* (for eventual movement to another location) by the substrate handler 104*a*, new substrate(s) that have previously been placed on the substrate load station 104*b* are taken from the substrate load station 104*b* by the substrate handler 104*a* and moved into SPS 100 for processing. The system interface 104 (including the substrate handler 104*a*, substrate load station 104*b* and substrate unload station 104*c*) can be implemented using conventional apparatus and methods known to those skilled in the art of processing substrates. SPS 100 of one or more alternative embodiments can include multiple system interfaces, each of which can be constructed and operate as described above.

Once in SPS 100, a substrate handling system 105 can be used to move substrate(s) processed by SPS 100 between different processing modules 101, 102, and 103 of the SPS 100. Like the substrate handler 104*a* of the system interface 104, the substrate handling system 105 can be implemented, for example, using one or more robots. If processing modules 101, 102, and 103 include both wet and dry processing modules, then the substrate handling system 105 includes at least two types of apparatus: a dry substrate handler for moving substrate(s) into and out of dry processing modules and the system interface 104 and out of a drying module, and a wet substrate handler for moving substrate(s) into and out of wet processing modules and into a drying module. The substrate handling system 105 can be implemented using apparatus and methods known to those skilled in the art of processing substrates.

Other than when substrate(s) are being moved into or out of SPS 100 through the system interface 104, SPS 100 is sealed from the external environment. Depending on the processing to be performed by SPS 100, the environment within SPS 100 that is outside of the pre-processing module 101, processing module 102, and post-processing module 103 (for convenience, sometimes referred to hereinafter as the "system environment") can be maintained at atmospheric pressure, held at a vacuum pressure, and/or pressurized (i.e., held at a pressure above atmospheric pressure). Similarly, the system environment can be maintained at the ambient temperature of the environment outside of SPS 100, or at a temperature that is higher or lower than that ambient temperature.

Further, the gaseous composition of the system environment can be controlled as desired. For example, the system environment can be ambient air (typically, controlled to reduce contamination from the external environment). The system environment can also be controlled to include, in whole or in part, a specified gas or gases, e.g., in a system used to process semiconductor wafers, the system environment can be controlled to be nitrogen or an inert gas. The system environment can also be controlled to exclude a specified gas or gases, e.g., oxygen can be excluded from the system environment to reduce the occurrence of oxidation of substrate(s) (or material(s) formed thereon) processed in the system.

The SPS of an alternative embodiment can include different types of modules used to process a single wafer or single batch of wafers. Therefore, multiple versions of the SPS can operate in parallel as a single system. This approach can improve the throughput of substrates processed by the SPS. This approach can also add redundancy so that system availability can be maintained even when one or more of the modules of the system are rendered non-operational for a period of time (e.g., for preventative maintenance, repair, etc.).

The SPS described above is presented as an example, and systems including other numbers of processing modules can be used. Furthermore, types of processing modules other than those described above can be used. Manual loading and unloading of substrate(s) may be used in some processing systems instead of a substrate handler for moving substrate(s) into and out of the system.

The SPS 100 described above can include one or more modules (also referred to as components) and/or methods for combinatorially processing regions on a single substrate. Generally, an array of regions is combinatorially processed by delivering processing materials to one or more regions on a substrate and/or modifying the regions. The regions on a substrate of an embodiment include but are not limited to pre-defined regions and regions identified during and/or as a result of processing of the substrate.

Figure 2:
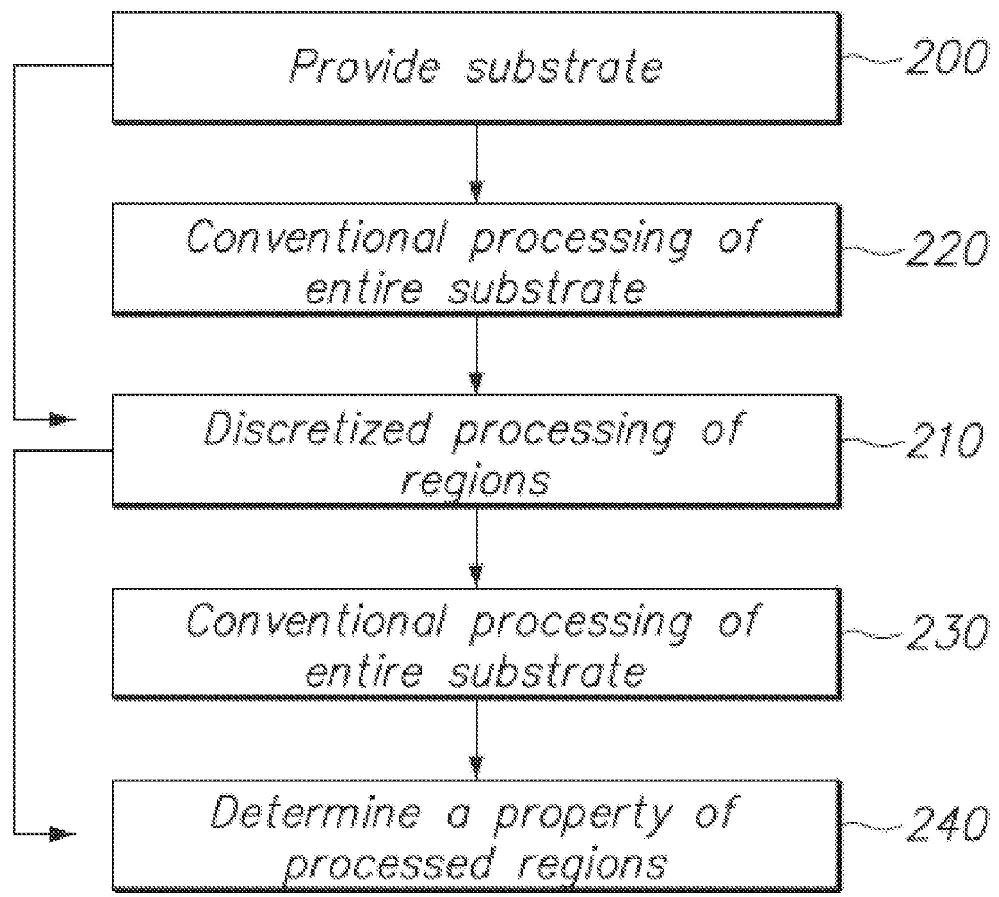
FIG. 2 is a flow diagram for combinatorial process sequence integration, in accordance with some embodiments.

FIG. 2 is a flow diagram for combinatorial process sequence integration, in accordance with some embodiments. The embodiment may utilize a processing tool (which may or may not be an integrated tool that includes discrete unit modules which collectively perform the effective unit process) that will perform the desired process for analysis. In one embodiment, the processing tool can perform the process in a discretized fashion within unique regions contained in a single monolithic substrate, such as a 300 mm diameter wafer used in IC manufacturing. The substrate is provided to the system during operation 200, and is processed in a discretized (e.g., site isolated) manner during operation 210. The processing of different sited may be performed either in sequence, parallel, or serial-parallel mode. At least two regions of the same substrate are processed differently from each other during operation 210. The substrate processed in the combinatorial fashion can optionally be processed in a conventional manner, before (as reflected by operation 220) and/or after (as reflected by operation 230) discretized processing (operation 210). For purposes of this disclosure, the conventional processing is defined as processing in which the entire or substantially close to the entire substrate (or, more specifically, the working surface of the substrate) is subject to the same processing conditions. This allows the described combinatorial processing/combinatorial process sequence integration approach to be used in desired segments of the process flow required to build an end device(s), integrated circuit, etc.

The processed regions, such as devices or portions of devices created on the substrate surface, can be tested (during testing operation 240) for a property of interest using conventional methods for analysis. Some examples of testing methods include parametric testing for properties, such as yield, via resistance, line resistance, capacitance, and the like, and/or reliability testing for properties, such as stress migration, electromigration, bias thermal stress, time dependent dielectric breakdown. Other testing techniques known to those of skill in the art may be used as well. The processed regions can be tested simultaneously, sequentially, or in a parallel-serial mode, where a first plurality of regions is simultaneously tested, followed by a second plurality of regions being simultaneously tested. The testing (operation 240) is optionally performed in one or more alternative embodiments of the methodology for combinatorial process sequence integration.

The combinatorial process sequence integration of an embodiment uses a processing tool referred to herein as a site-isolated processing tool, which may be also referred to as a site-isolated reactor (SIR). The SIR performs one or more processes. In one embodiment, the site-isolated processing tool processes a substrate in a discretized isolated fashion (either in a serial, parallel, or serial-parallel mode) within unique regions of the substrate (e.g., at least two regions of the substrate are processed differently from each other).

In some embodiments, a method under the combinatorial process sequence integration described herein receives a substrate after completing one of the following processes: depositing, patterning, etching, cleaning, planarizing, implanting, and treating. The method generates a processed substrate by processing at least one region of the substrate differently from at least one other region of the substrate. The processing includes modifying at least one region, wherein modifying includes at least one of physical modifications, chemical modifications, electrical modifications, thermal modifications, magnetic modifications, photonic modifications, and photolytic modifications. The processing forms at least one array of differentially processed regions on the substrate. In some embodiment, the processing described above includes modifying using at least one of materials, processing conditions, process sequences, process sequence integration, or process sequence conditions. In some embodiments, the processed substrate described above is subjected to at least one additional process, such as depositing, patterning, etching, cleaning, planarizing, implanting, and treating.

In some embodiments, a method under the combinatorial process sequence integration described herein generates a processed substrate by processing at least one region of the substrate differently from at least one other region of the substrate. The processing includes modifying at least one region, wherein modifying includes at least one of physical modifications, chemical modifications, electrical modifications, thermal modifications, magnetic modifications, photonic modifications, and photolytic modifications. The processing forms at least one array of differentially processed regions on the substrate. The method continues by providing the processed substrate to at least one additional process selected from a group including depositing, patterning, etching, cleaning, planarizing, implanting, and treating. In one embodiment, the processing described above includes modifying using at least one of materials, processing conditions, process sequences, process sequence integration, and process sequence conditions.

Figure 3:
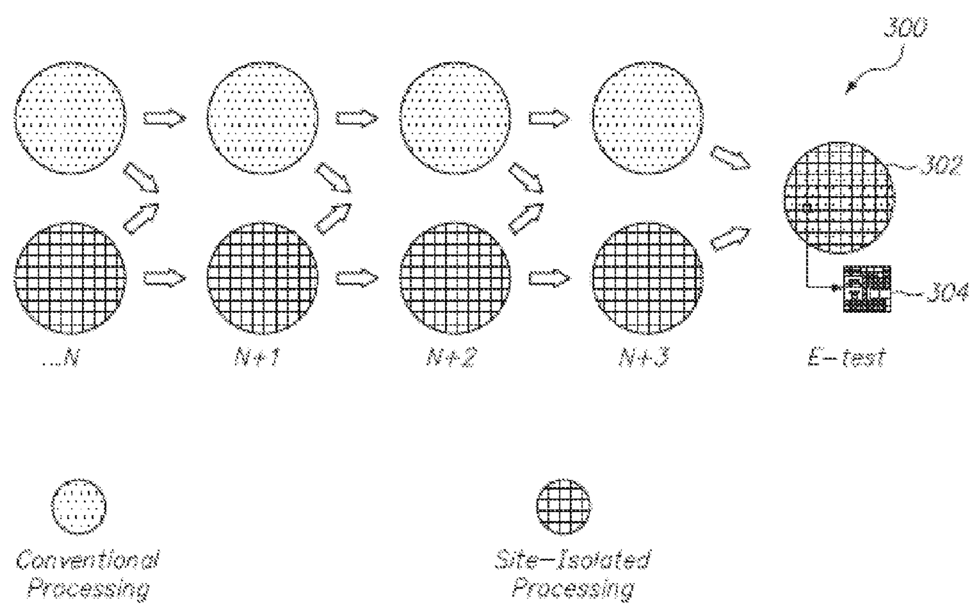
FIG. 3 is a combinatorial process sequence integration process flow that includes site-isolated processing and/or conventional processing, in accordance with some embodiments.

FIG. 3 is a combinatorial process sequence integration process flow 300 that includes site-isolated processing and/or conventional processing, in accordance with some embodiments. A processing sequence may include processing the substrate using Conventional Process N, then processing the substrate using Site-Isolated Process N+1, then processing the substrate using Site-Isolated Process N+2, then processing the substrate using Conventional Process N+3, then perform E-test (e.g., electrical testing). Another example of a processing sequence may involve processing the substrate using Site-Isolated Process N, then processing the substrate using Site-Isolated Process N+1, then processing the substrate using Conventional Process N+2, then processing the substrate using Site-Isolated Process N+3, and then performing E-test. Yet another example of a processing sequence involves processing the substrate using Site-Isolated Process N, then processing the substrate using Conventional Process N+1, then processing the substrate using Site-Isolated Process N+2, then processing the substrate using Conventional Process N+3, and then performing E-test. Various other processing sequences can be implemented according to the process flow 300.

The combinatorial process sequence integration thus generates, for example, a semiconductor wafer 302 including a die array that has multiple dies 304. The dies 304 can be test dies and/or actual product dies containing intended integrated circuitry. Blanket wafers, pattern wafers, devices, functional chips, functional devices, test structures, semiconductors, integrated circuits, flat panel displays, optoelectronic devices, data storage devices, magnetoelectronic devices, magnetooptic devices, molecular electronic devices, solar cells, photonic devices, and packaged devices can be processed and/or generated using the aforementioned combinatorial process sequence integration methodology. The combinatorial process sequence integration can be applied to any desired segment(s) and/or portion(s) of an overall process flow. Characterization, including electrical testing, can be performed after each process step, and/or series of process steps within the process flow as needed and/or desired.

The SPS forms materials in one or more site isolation regions on the substrate using a number of different techniques. For example, the processing materials can be reacted using, for example, solution based synthesis techniques, photochemical techniques, polymerization techniques, template directed synthesis techniques, epitaxial growth techniques, by the sol-gel process, by thermal, infrared or microwave heating, by calcination, sintering or annealing, by hydrothermal methods, by flux methods, by crystallization through vaporization of solvent, etc. Other useful reaction techniques that can be used to react the processing materials of interest will be readily apparent to those of skill in the art.

Since the regions of the substrate are processed independently of each other, the processing conditions at different regions can be controlled independently. As such, process material amounts, reactant solvents, processing temperatures, processing times, processing pressures, the rates at which the reactions are quenched, deposition order of process materials, process sequence steps, etc. can be varied from region to region on the substrate. Thus, for example, when exploring materials, a processing material delivered to a first and a second region can be the same or different. If the processing material delivered to the first region is the same as the processing material delivered to the second region, this processing material can be offered to the first and second regions on the substrate at either the same or different concentrations. This is true as well for additional processing materials delivered to the first and second regions, etc. As with the processing material delivered to the first and second regions, the additional processing materials delivered to the first and second regions can be the same or different and, if the same, can be offered to the first and second regions on the substrate at either the same or different concentrations.

Moreover, within a given predefined region on the substrate, the processing materials can be delivered in either a uniform or gradient fashion. If the same processing materials are delivered to the first and second regions of the substrate at identical concentrations, then the conditions (e.g., reaction temperatures, reaction times, etc.) under which the regions are processed can be varied from region to region. Variable parameters include, for example, material amounts, solvents, process temperatures, process times, the pressures at which the processes are carried out, the atmospheres in which the processes are conducted, the rates at which the processes are quenched, the order in which the materials are deposited, etc. Other process parameters which can be varied will be apparent to those of skill in the art.

Moreover, an embodiment provides for forming at least two different arrays of materials by delivering substantially the same processing materials at approximately identical concentrations to corresponding regions on both first and second substrates having different surfaces, such as a dielectric material surface and an electrically conductive surface, in order to represent different portions of regions on an IC chip, and, thereafter, subjecting the process materials on the substrates to a first set of process conditions. Using this method, the effects of the process parameters or materials on the various substrate surfaces can be studied and, in turn, optimized.

The processing materials utilized in the processing of the individual regions must often be prevented from moving to adjacent regions. Most simply, this can be ensured by leaving a sufficient amount of space between the regions on the substrate so that the various processing materials cannot interdiffuse between regions. Moreover, this can be ensured by providing an appropriate barrier between the various regions on the substrate during processing. In one approach, a mechanical device or physical structure defines the various regions on the substrate. A wall or other physical barrier, for example, can be used to prevent the materials in the individual regions from moving to adjacent regions. This wall or physical barrier may be removed after the synthesis is completed. One of skill in the art will appreciate that, at times, it may be beneficial to remove the wall or physical barrier before screening the array of materials.

In other embodiments, the processing may be effected without the need of barriers which physically touch the substrate. For example, lasers, radiative lamps, UV radiation sources, other "point" sources can be used to process regions in a site addressable fashion as the area of modification is nominally smaller and/or equivalent in size to the discrete regions of interest on the substrate. In yet another embodiment, a physical barrier can be used to essentially screen and/or limit the processing to a desired region(s) and/or portion(s) of a region(s) wherein the physical barrier does not physically touch the substrate. For example, a physical barrier can be used to essentially block and/or restrict processing to certain region(s) and/or portion(s) or region(s). A screen, such as a mask or shutter, can be used to block vapor fluxes such as from PVD (i.e., sputtering) or evaporation sources for example. An opaque vs. transparent mask can be used to let certain radiation through the transparent regions to effect processing in specified regions on the substrate. In yet another embodiment, gas flows, of preferably an inert gas such as argon (Ar), can be used to screen out gaseous reagents and or limit the concentrations of such reagents so as to effectively screen out the effects of such reagents from certain regions. In this fashion, specific regions on a substrate can be processed differently without the need for a physical barrier in communication with the substrate. This approach is particularly amenable to sequential gas phase vacuum based surface kinetic processes such as atomic layer deposition and various forms thereof (e.g., ion, radical, and plasma induced/enhanced).

The SPSs of an embodiment include processing tools configured to provide both uniform processing across an entire substrate and independent processing of one or more discrete regions of the substrate individually. The processing tools described herein, which include operations under the combinatorial process sequence integration process flows described above with reference to FIGS. 2 and 3, can be a component of a substrate processing system like the SPS 100 described above and/or one or more modules of the SPS 100 described above with reference to FIG. 1. The combinatorial process sequence integration process flow 300 of FIG. 3 can be implemented in a processing module 102 of the SPS 100 shown in FIG. 1, for example. Similarly, the combinatorial process sequence integration process flow 300 can be implemented across one or more processing modules 101, 102, and 103 of the SPS 100, shown in FIG. 1.

Figure 4:
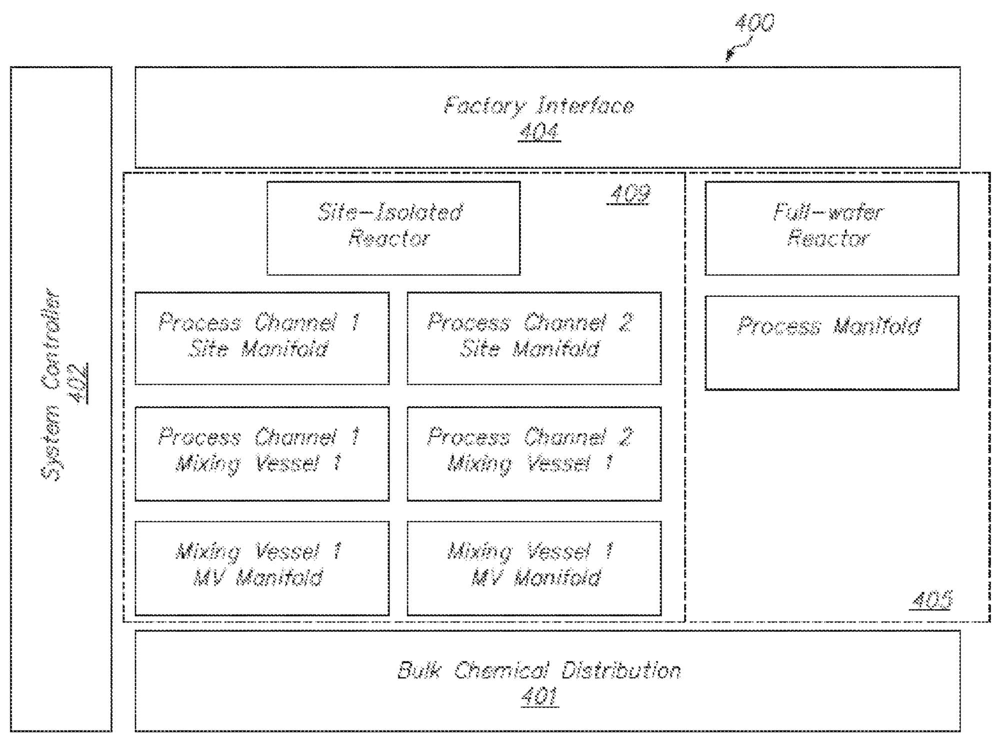
FIG. 4 is a block diagram of the integrated processing tool, referred to herein as a Multiple Channel Site-Isolated Reactor (MCSIR), in accordance with some embodiments.

The SPSs of an embodiment includes an integrated processing tool that supports both full-wafer processing and combinatorial processing. FIG. 4 is a block diagram of the integrated processing tool, referred to herein as a Multiple Channel Site-Isolated Reactor (MCSIR) 400, in accordance with some embodiments. MSCIR 400 may include a full-wafer processing module 405 and a site-isolated processing module (SIPM) 409, as described in detail below. MCSIR 400 incorporates a bulk chemical distribution system 401 to provide the raw chemicals necessary to provide the process sequence, as well as chemical mixing and sequencing hardware. The bulk chemical distribution system 401 is in the form of mixing vessels and distribution manifolds to provide the ability to dynamically mix chemical solutions of any composition as well as to sequence the chemicals through the reactors in any order for any time duration. MCSIR 400 is controlled using a computerized hardware controller, i.e., a system controller 402. The system controller 402 may be used to control processing in both the full-wafer reactor of the full-wafer processing module 405 and the site-isolated reactor of SIPM 409. Wafers are sequenced through MCSIR 400 using a factory interface 404. The full-wafer and site-isolated reactors are comparable in all control aspects. Each reactor or channel of MCSIR 400 is configured to allow the implementation of complex wet/vapor-process sequences as described herein.

Generally, the full-wafer processing module 405 includes a process manifold coupled to a full-wafer reactor. The process manifold is coupled to the bulk chemical distribution system 401 and is configured to feed or deliver the chemicals supplied from the bulk chemical distribution system 401 to the full-wafer reactor. The full-wafer reactor is configured to effect uniform processing across the entire wafer or substrate surface (e.g., 8-inch wafer, 12-inch wafer, etc.) using the delivered chemicals.

In contrast, the SIPM 409 is a site-isolated processor that enables independent processing of multiple discrete regions (e.g., 28 regions) across the wafer using multiple channels or process paths. These regions are also referred to herein as site isolated regions. This example of the SIPM 409 shows a single site-isolated reactor being fed by either of two process paths or channels for the sake of clarity of this example, but the MCSIR can include any number of site-isolated reactors and any number of process paths connected to each reactor.

The SIPM 409 feeds or distributes the chemicals 401 using a delivery system generally including a set or assembly of first manifolds (e.g., mixing vessel (MV) 1 manifold). An output of each first manifold is coupled to a mixing vessel (e.g., mixing vessel 1, etc.). The mixing vessel manifolds allow mixing of the bulk chemicals in any ratio for each of the mixing vessels, and the mixing vessels then serve as temporary storage for the mixed chemical solutions.

The output of each mixing vessel feeds one or more of a set of second manifolds (e.g., process channel 1 site manifold, process channel 2 site manifold). An output of each set of second manifolds feeds a site-isolated reactor. The set of second manifolds generally allows sequencing of the mixing vessel solutions and/or bulk chemicals through either of two process paths (e.g., channel 1, channel 2) in a set of flow cells. The flow cells include the top surface of the site-isolated reactor, and reactor sleeves include the side walls of the reactor. The processed substrate includes the bottom of the reactor. Each site-isolated reactor effects individual processing of a dedicated region of the substrate as described herein.

The example of MCSIR 400 does not include a mixing vessel in the process path for the full-wafer reactor. However, it is possible and sometimes desirable to include a mixing vessel in the full-wafer reactor process path in order to configure the full-wafer processing module in a manner similar to that of the SIPM.

Figure 5:
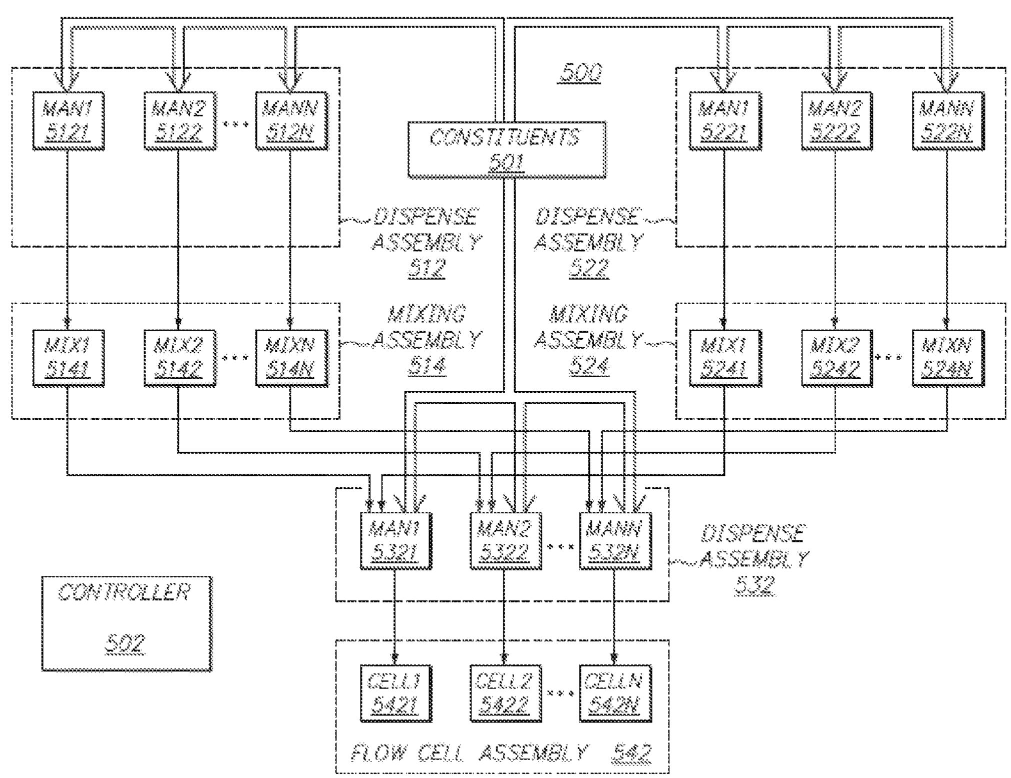
FIG. 5 is a site-isolated processing module (SIPM) of a MCSIR, in accordance with some embodiments.

FIG. 5 is a SIPM 500 of a MCSIR, in accordance with some embodiments. The SIPM 500 manages or controls simultaneous processing of different regions of a substrate by simultaneously controlling reactions in multiple parallel reactors. Each of the reactors is located proximate to a particular region of a substrate (e.g., wafer). The reactor control includes controlling reagent flow, reagent mixing, reagent delivery, reagent and/or reactor temperature, and/or reagent pH to name a few.

The SIPM 500 includes a first dispense assembly 512 coupled to a first mixing assembly 514. The first dispense assembly 512 includes a number N of mixing vessel manifolds 5121-512N, where the number N of mixing vessel manifolds can be any number. The first dispense assembly 512 of an embodiment includes twenty-eight (28) mixing vessel manifolds, but the SPS is not limited to this number of mixing vessel manifolds and can include any number of mixing vessel manifolds. The inputs of each of the mixing vessel manifolds are coupled to one or more of the chemical sources, labeled as chemicals 501 in FIG. 5. As an example, a mixing vessel manifold of an embodiment includes eight (8) inputs, and each of the inputs is connected to a different one of the chemicals 501. The mixing vessel manifolds are however not limited to eight (8) inputs, and each input is not limited to connection to a different constituent from any other manifold input. Additionally, all mixing vessel manifolds of the dispense assembly 512 are not limited to being of the same configuration. Furthermore, other components (e.g., valves, regulators, mixers, pumps, etc.) can be connected inline between the constituents and the mixing vessel manifolds.

The first mixing assembly 514 includes a number N of mixing vessels 5141-514N, where the number N of mixing vessels can be any number. The first mixing assembly 514 of an embodiment includes twenty-eight (28) mixing vessels, but the SPS is not limited to this number of mixing vessels and can include any number of mixing vessels. The inputs of each of the mixing vessels are coupled to outputs of the mixing vessel manifolds of the first dispense assembly 512. As an example, the mixing vessel of an embodiment includes one (1) input that is connected to an output of a mixing vessel manifold of the first dispense assembly 512. As a more specific example, an input of a first mixing vessel 5141 is connected to an output of a first mixing vessel manifold 5121. The mixing vessels are however not limited to one (1) input, and each input is not limited to connection to one mixing vessel manifold of the first dispense assembly 512.

The SIPM 500 further includes a second dispense assembly 522 coupled to a second mixing assembly 524. The second dispense assembly 522 includes a number N of mixing vessel manifolds 5221-522N, where the number N of mixing vessel manifolds can be any number. The second dispense assembly 522 of an embodiment includes twenty-eight (28) mixing vessel manifolds, but the SPS is not limited to this number of mixing vessel manifolds. The inputs of each of the mixing vessel manifolds are coupled to one or more of the chemicals 501. As an example, and as described above, the mixing vessel manifold of an embodiment includes eight (8) inputs, and each of the inputs is connected to a different one of the chemicals 501. The mixing vessel manifolds are however not limited to eight (8) inputs, and each input is not limited to connection to a different constituent from any other manifold input. Additionally, other components (e.g., valves, regulators, mixers, etc.) can be connected inline between the constituents and the mixing vessel manifolds.

The second mixing assembly 524 includes a number N of mixing vessels 5241-524N, where the number N of mixing vessels can be any number. The second mixing assembly 524 of an embodiment includes twenty-eight 28 mixing vessels, but the SPS is not limited to this number of mixing vessels. The inputs of each of the mixing vessels are coupled to outputs of the mixing vessel manifolds of the first dispense assembly 522. As an example, the mixing vessel of an embodiment includes one (1) input that is connected to an output of a mixing vessel manifold of the first dispense assembly 522. As a more specific example, an input of a first mixing vessel 5241 is connected to an output of a first mixing vessel manifold 5221. The mixing vessels are however not limited to one (1) input, and each input is not limited to connection one mixing vessel manifold of the first dispense assembly 522.

The SPS is modular so alternative embodiments of the SPS can include a different number of dispense assemblies and/or mixing assemblies. For example, the SPS of an alternative embodiment can include two additional dispense assemblies, with each additional dispense assembly coupled to an additional mixing assembly. As another example, the SPS of an alternative embodiment includes only the first dispense assembly 512 and first mixing assembly 514 described above, and does not include the second dispense assembly 522 and second mixing assembly 524. Furthermore, the SPS of alternative embodiments can include a smaller or larger number of mixing vessel manifolds and/or mixing vessels than described above. Additionally, alternative embodiments include different configurations of mixing vessel manifolds and/or mixing vessels; for example, two mixing vessel manifolds can be coupled to a single mixing vessel.

The SIPM 500 includes a third dispense assembly 532. The third dispense assembly 532 includes a number N of site manifolds 5321-532N, where the number N of site manifolds can be any number. The third dispense assembly 532 of an embodiment includes twenty-eight 28 site manifolds, but the SPS is not limited to this number of site manifolds. Each site manifold of an embodiment includes eight (8) inputs, but is not so limited. A first input of each site manifold is connected to an output of a mixing vessel of the first mixing assembly

514, and a second input of each site manifold is connected to an output of a mixing vessel of the second mixing assembly 524. Therefore, using a first manifold 5321 of the third dispense assembly 532 as a more specific example, a first input of the first site manifold 5321 is connected to an output of a first mixing vessel 5141 of the first mixing assembly 514, and a second input of the first site manifold 5321 is connected to an output of a first mixing vessel 5241 of the second mixing assembly 524. One or more of the remaining inputs of each site manifold of the third dispense assembly 532 is connected to one or more of the chemicals 501 as appropriate to the instant processing operations of the SIPM 500. Remaining inputs of each site manifold can however be coupled to other constituent sources in alternative embodiments. Other components (e.g., valves, regulators, mixers, pumps, etc.) can be connected inline between the constituents and the third dispense assembly 532.

Outputs of the third dispense assembly 532 are coupled to a flow cell assembly 542. The flow cell assembly 542, which is proximate to a substrate as described above, includes a number N of flow cells 5421-542N, where the number N of flow cells can be any number. As an example, the flow cell assembly 542 of an embodiment includes 28 flow cells, but the SPS is not limited to this number of flow cells. Each flow cell of an embodiment includes one (1) input, but is not so limited. The input of each flow cell is coupled to outputs of the site manifolds of the third dispense assembly 532. For example, the flow cell of an embodiment includes one (1) input that is connected to an output of a site manifold of the third dispense assembly 532. As a more specific example, an input of a first flow cell 5421 is connected to an output of a first site manifold 5321 of the third dispense assembly 532. The interior of the flow cells can be configured or reconfigured to tailor fluid flow; for example, the interior cavity can be any shape and/or the surface profiles of the interior can be varied so as to control velocities of fluids. Other components (e.g., valves, regulators, mixers, pumps, etc.) can be connected inline between the third dispense assembly 532 and the flow cell assembly 542.

The flow cell assembly 542 therefore includes a series of parallel cells forming site-isolated reactors configured to effect site-isolated processing on a proximate region of a substrate. The site-isolated processing includes processing including the constituents or compositions delivered to each cell or reactor of the flow cell assembly 542 as described above.

The embodiment of the SIPM 500 described above includes an equivalent number N of each of mixing vessel manifolds of the first dispense assembly 512, mixing vessel manifolds of the second dispense assembly 522, site manifolds of the third dispense assembly 532, mixing vessels of the first mixing assembly 514 and second mixing assembly 524, and flow cells of the flow cell assembly 542. As described above, however, alternative embodiments can include different numbers of one or more of the mixing vessel manifolds of the first dispense assembly 512, mixing vessel manifolds of the second dispense assembly 522, site manifolds of the third dispense assembly 532, mixing vessels of the first mixing assembly 514 and second mixing assembly 524, and flow cells of the flow cell assembly 542 as appropriate to a processing operations.

A controller 502 is coupled to various components of the SIPM 500 as described above and controls processing operations. The SIPM 500 generally provides processing operations that include global mixing of multiple constituents (e.g., chemicals, composition, etc.) to form a variety of combinations of compositions at each of the first mixing assembly 514 and the second mixing assembly 524. The compositions at this mixing level are delivered to the third dispense assembly 532 at which point additional constituents can be sequenced with the compositions; the resulting compositions are then delivered via the flow cells to a number N of parallel sites on a substrate. The SIPM 500, which supports liquid, gas, and/or plasma reagents, provides the resulting compositions under controlled conditions including controlling chemical composition, chemical sequencing, temperature, pH, in-line mixing, and local environment control to name a few. The SIPM 500 therefore enables flow control of various reagents (having various states) in such a manner as to effect continuous flow of reagents to numerous substrate site or regions in parallel. The SIPM 500 thus allows operators to effect parallel processing at different regions of a substrate while managing multiple flows, flow dynamics, and multiple channels using a minimum set of flow controls.

The SIPM 500 described above is modular and can include any number of any of the components described above. Components (e.g., dispense assembly, mixing vessel manifold, site manifold, mixing assembly, mixing vessels, flow cell assembly, flow cells) can be added or removed from the SIPM 500 as necessary to support processing operations. Furthermore, configurations of components include any number of configurations and are not limited to the configurations described above. For example, changing flow cell form factor (e.g., square instead of circular) involves changing only a top plate of the flow cell. Thus, the SPS is flexible in terms of configurability and ability to handle different types of processing.

Figure 6:
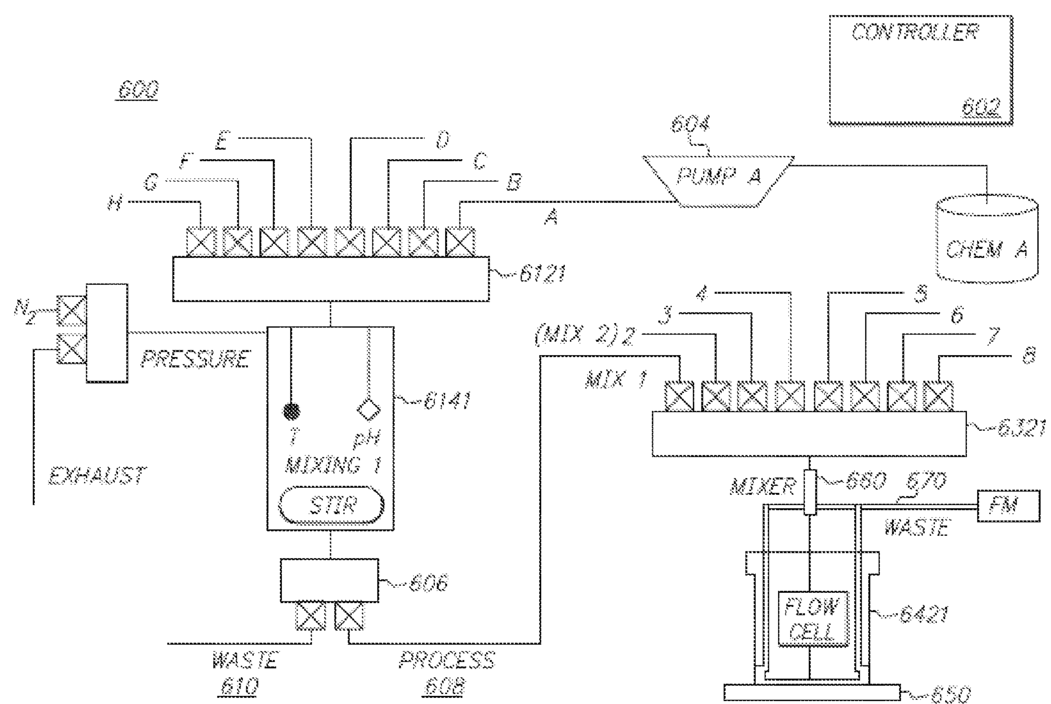
FIG. 6 shows couplings between a subset of components of the SIPM, in accordance with some embodiments.

FIG. 6 shows couplings between a subset of components in a SIPM 600, in accordance with some embodiments. The SIPM 600 includes a first mixing vessel manifold 6121 that includes eight (8) inputs A-H. Each of the inputs is coupled to a constituent in order to selectively receive the constituents during processing operations. As one example of a connection between a constituent and the first mixing vessel manifold 6121, input A of the manifold 6121 is connected to chemical A via a pump 604. The pump 604 is a metering pump used to fill the vessels but is not so limited; alternative embodiments may not include the pump, may include multiple inline pumps, and/or may include a different type of pump. The pump 604 of an embodiment includes a metering pump that allows for precise control of volumetric ratios of each material but is not so limited. Other components (e.g., valves, regulators, mixers, pumps, etc.) can be connected inline between the container holding a constituent (e.g., chemical A) and the pump 604 and/or between the pump 604 and the manifold input A. Other MCSIR components and/or constituents or chemicals (not shown) can be coupled to inputs A-H of the first mixing vessel manifold 6121 in a similar fashion. The first mixing vessel manifold 6121 can be a component of a dispense assembly as described above, but is not so limited.

The SIPM 600 includes a mixing vessel 6141 having an input connected to the output of the first mixing vessel manifold 6121. The mixing vessel 6141 therefore receives the constituents flown from the first mixing vessel manifold 6121. The mixing vessel 6141 of an embodiment allows for control of parameters under which a composition is generated in the vessel 6141, the parameters including pressure, temperature, and pH to name a few. The mixing vessel 6141 can include devices for stirring or agitating the received constituents. The mixing vessel 6141 includes or is coupled or connected to a flow mechanism 606 that functions to flow compositions from the mixing vessel 6141. As an example, the flow mechanism 606 includes connections for directing the composition to a process 608 or away from a process to waste 610; other routings (not shown) are possible. The mixing vessel 6141 can be a component of a mixing assembly as described above, but is not so limited.

The SIPM 600 includes a site manifold 6321 that includes eight (8) inputs 1-8. One of the inputs 1 is connected to receive the composition output MIX1 of the mixing vessel 6141. Other inputs of the site manifold 6321 can be connected to receive other constituents and/or compositions. For example, as described above, another input 2 of the site manifold 6321 can be connected to receive the composition output MIX2 of another manifold and/or mixing vessel. Further, other or remaining inputs 3-8 of the site manifold 6321 can be coupled to one or more other constituents (not shown).

Output of the site manifold 6321 is connected to a flow cell 6421 that is proximate to a region of a substrate 650. The SIPM 600 includes an optional inline mixer 660 between the site manifold 6321 and the flow cell 6421 for providing inline mixing. The flow cell 6421 receives the composition from the manifold 6321 and uses the composition to process the substrate region during the processing operations. The flow cell 6421 is connected to a waste line 670 that directs effluent (waste) away from the flow cell 6421. The waste line 670 can include a vacuum manifold or valve (not shown) for removing process effluent from the flow cell 6421. The flow cell 6421 can be a component of a flow cell assembly as described above, but is not so limited. A controller 602 is coupled to components of the SIPM 600 and controls processing operations as described below.

An embodiment of SIPM 600 includes a flow meter FM in the waste line in order to characterize the flow through the waste line rather than characterizing flow through the cell. This eliminates the need for numerous flow controllers and instead requires only one flow controller for a single solvent system; multiple flow controllers would be used with multiple solvent systems (e.g., three flow controllers used in system with acid, base and organic solvents).

The components of the SIPM, including the dispense assembly, mixing vessel manifold, mixing assembly, mixing vessels, flow cell assembly, and flow cell, vary in number and configuration as described above. These components are coupled or connected using a variety of other components and/or materials that include valves, tubing or conduit, dispense pumps, flow regulators, pressure regulators, and controllers to name a few. These other components and/or materials include components and/or materials known in the art as appropriate to the configuration and the processing operations.

The configuration of the SIPM described above allows bulk chemicals to be directed to a mixing vessel, through the mixing vessel manifold, and/or to the site-isolated reactor, through the site manifold. If directed to the mixing vessel, the control system enables mixing of solutions of arbitrary composition. The composition of the solution can be varied independently across each of the mixing vessels. The mixing vessels are implemented is such a fashion as to allow stirring, heating, and pH control of the resulting solutions. In addition, the pH and temperature of the resulting solutions can be monitored per flow cell. Furthermore, the flow rate of each solution through the site manifolds is independently variable.

As described above, each manifold (e.g., mixing vessel manifolds, site manifolds) includes a number of inputs or valves (e.g., X inputs, where X is any number 1, 2, . . . ), with each valve coupled or connected to a different chemical source. The chemical source may be liquid, gas or vacuum, for example. The manifold is configured so that the chemicals received at the manifold inputs exit the manifold through a common path. Consequently, the manifold is referred to as an X:1 manifold. The chemicals can be sequenced individually through the manifold or in combinations. When sequenced in combination, an in-line mixer can be used to ensure homogeneous chemical solutions. Check valves can also be incorporate at the entrance of each of the X chemicals to ensure that no backstreaming and, consequently, unwanted mixing of the chemicals occurs.

Dispensing Panel Examples

Figure 7:
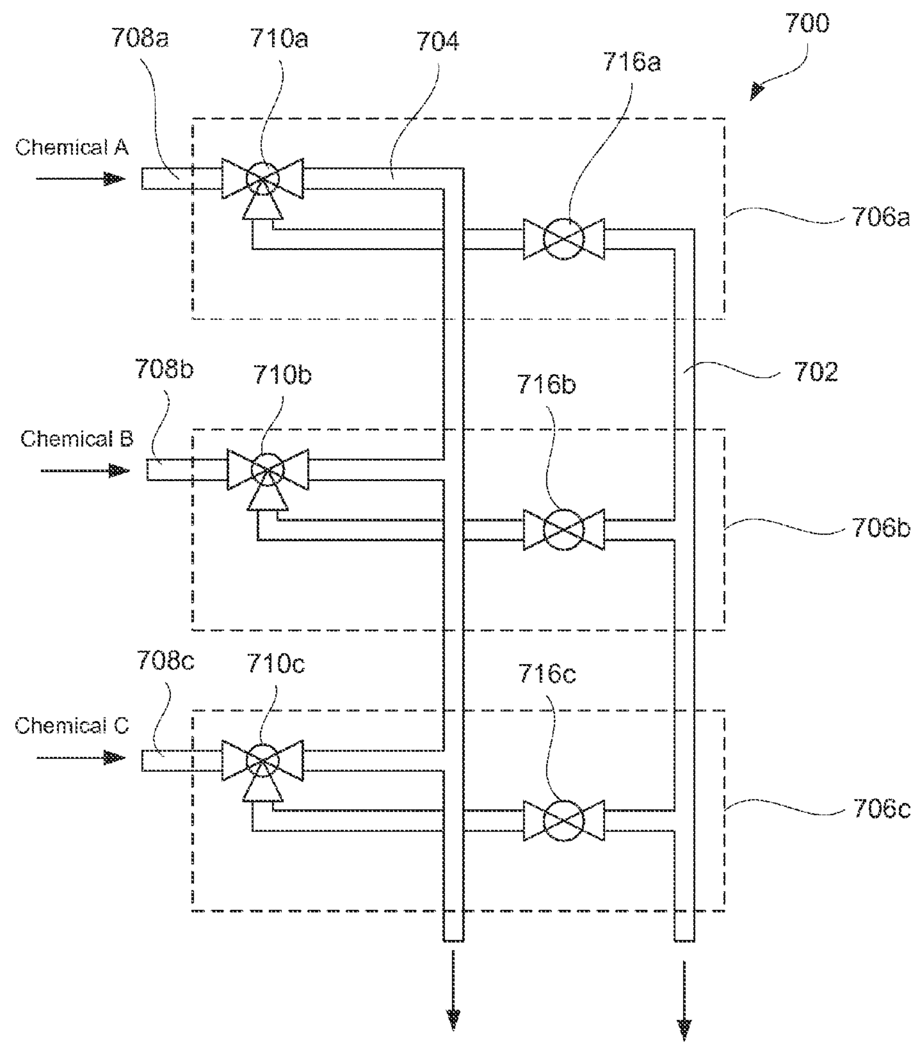
FIG. 7 is a schematic illustration of a dispense panel including three inlet lines and corresponding three-way valves and dispense valves as well as waste manifolds and dispense manifolds, in accordance with some embodiments.

FIG. 7 illustrates a dispense panel 700 for dispensing different chemicals for use in high productivity combinatorial processing, in accordance with some embodiments. In some embodiments, dispense panel 700 includes two manifolds, i.e., a dispense manifold 702 and a waste manifold 704. Dispense manifold 702 is connected to multiple dispense valves 716*a*-716*c*, while waste manifold 704 is connected to multiple three-way valves 710*a*-710*b*. Each dispense valve has a corresponding three-way valve, which can either direct the flow towards the dispense valve or towards waste manifold 704. A combination of a dispense valve and a corresponding three-way valve may be referred to as a dispense set. Thus, dispense panel 700 is shown with three dispense sets 706*a*-706*c*, such that dispense set 706*a* includes dispense valve 716*a* and three-way valve 710*a*, dispense set 706*b* includes dispense valve 716*b* and three-way valve 710*b*, and dispense set 706*c* includes dispense valve 716*c* and three-way valve 710*c*. Each dispense set is connected to one of inlet lines 708*a*-708*c* for supplying chemicals into dispense panel 700.

In general, any number of dispense sets may be used in the same dispense panel. This number generally depends on a number of different chemicals needed for HPC processing, flow rates, volumes, throughput time, and other considerations. If more chemicals are needed, multiple dispense panels may be used on the same HPC tool. For example, a dispense module may include 7 dispense sets, one set being connected to the inert gas supply, another—to D1 water supply, and 5 remaining ones—to process chemical supplies.

A combination of one dispense manifold and all dispense sets connected to this manifold may be referred to as a dispense module. Typically, a dispense set can be only connected to one dispense manifold, even though the same dispense manifold may be and is typically connected to multiple dispense sets. In some embodiments, a dispense panel may include multiple dispense modules (e.g., two dispense modules), each having its own dispense manifold and multiple dispense sets.

As shown, dispense valves 716*a*-716*c* are used to control the flow in and out of dispense manifold 702. The flow through these dispense valves 716*a*-716*c* may be in a direction towards dispense manifold 702 or in a direction away from dispense manifold 702. This direction is controlled by three-way valves 710*a*-710*c* as further described below.

Three-way valves 710*a*-710*c* provide two flow options, which will now be described with reference to the valve 710*a*. One option, which corresponds to the supplying position of the valve 710*a*, allows the flow between inlet line 708*a* and dispense valve 716*a* or, more specifically, from inlet line 708*a* towards dispense valve 716*a*. Another option, which corresponds to the priming position of the valve 710*a*, allows the flow between waste manifold 704*a* and dispense valve 716*a* or, more specifically, from dispense valve 716*a* and into waste manifold 704. In other words, three-way valve 710*a* is always open to dispense valve 716*a* and puts this valve into a flow communication with either waste manifold 704 (during priming) or with inlet line 708*a* (during supplying). These options and positions are also applicable to all other three-way valves.

Processing Examples

Figure 8:
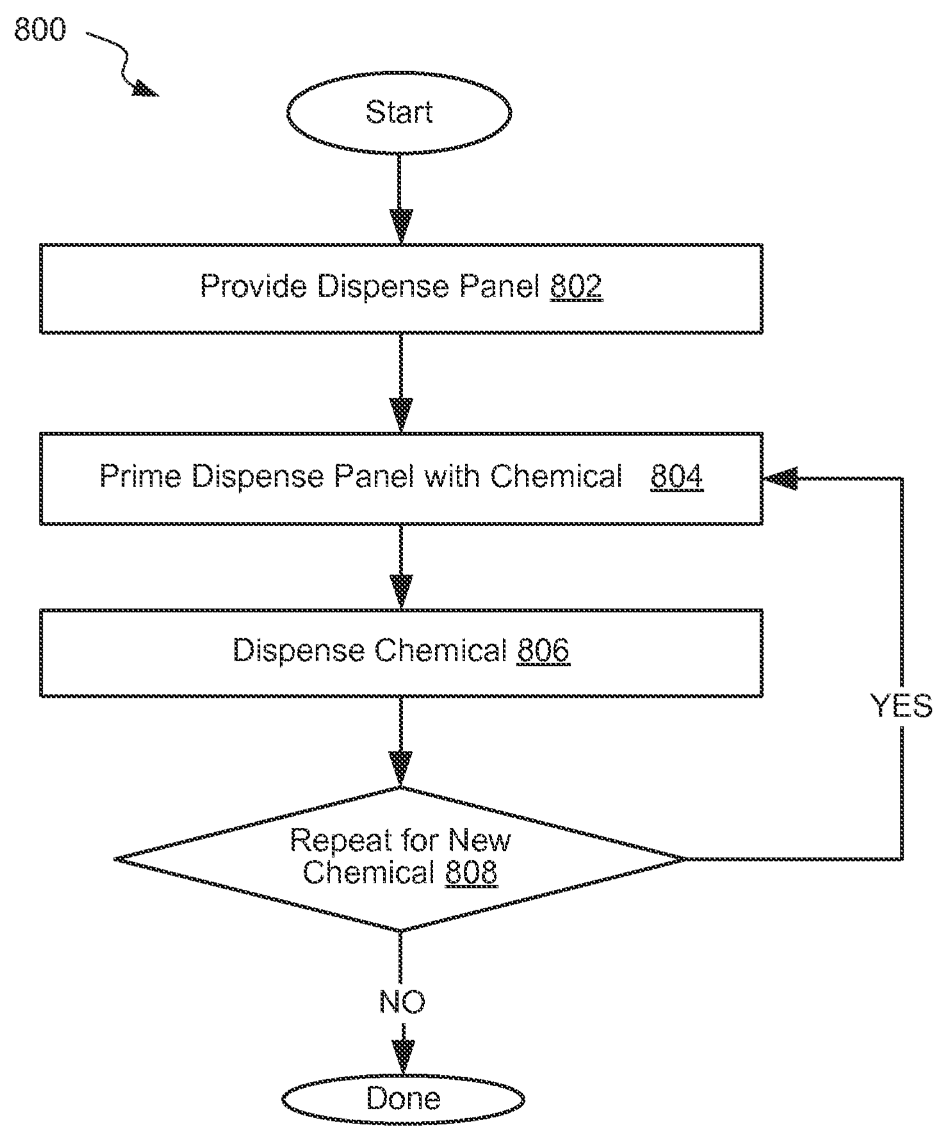
FIG. 8 is a process flowchart corresponding to a method of dispensing different chemicals using a dispense panel, in accordance with some embodiments.
Figure 9A:
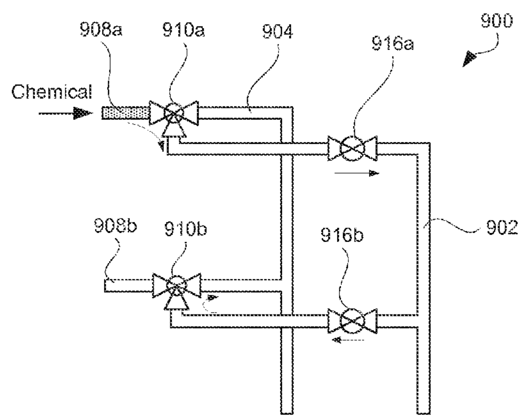
FIGS. 9A-9F are schematic illustrations of a dispense panel including two inlet lines and corresponding three-way valves and dispense valves as well as waste manifolds and dispense manifolds during different operating stages, in accordance with some embodiments.

FIG. 8 is a process flowchart corresponding to a method 800 of dispensing different chemicals for use in HPC processing, in accordance with some embodiments. Method 800 may commence with providing a dispense panel during operation 802. Various example of dispense panels are described above and elsewhere in this disclosure. Method 800 may proceed with priming the dispense panel with a first chemical during operation 804. This operation will now be described with reference to FIGS. 9A-9C. Specifically, FIG. 9A illustrates a dispense panel 900 before the priming operation. Dispense panel 900 includes dispense manifold 902, waste manifold 904, and valves 910*a*, 910*b*, 916*a*, and 916*b*. Dispense panel 900 represents a simplified version of a dispense panel described above with reference to FIG. 7. Specifically, dispense panel 900 includes only two dispense sets, while the dispense panel described above with reference to FIG. 7 includes three dispense sets. However, the operating principals of the two dispense panels are the same.

Figure 9B:
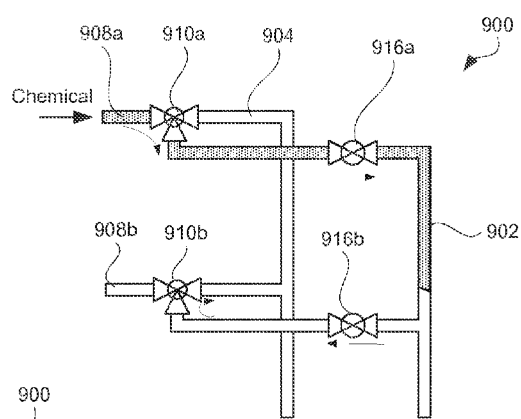

Dispense manifold 902 and valves 910*a*, 910*b*, 916*a*, and 916*b* may be empty and/or filled with another chemical prior to priming dispense panel with the first chemical. The first chemical for priming is supplied from inlet line 908*a* and into three-way valve 910*a*. Three-way valve 910*a* is kept in its supplying position, which means the first chemical is allowed to flow towards dispense valve 916*a*. Dispense valve 916*a* is kept open to allow the first chemical into dispense manifold 902. FIG. 9B illustrates the same dispense panel 900 during the priming operation or, more specifically, before completing the priming operation.

Continuing with the description of the priming operation, the first chemical flows into dispense manifold 902 and is allowed to be displaced out of dispense manifold 902 through another dispense valve 916*b*. For sufficient priming, the first chemical need at least to reach dispense valve 916*b*. In some embodiments, a sufficient amount of the chemical is allowed to flow through dispense valve 916*b* to displace substantially all gas bubbles and other chemicals from dispense manifold 902, which extends to all dispense valves of dispense panel 900. A portion of the first chemical that passes through dispense valve 916*b* is diverted by three-way valve 910*b* (which is in its priming position) into waste manifold 904.

Figure 9C:
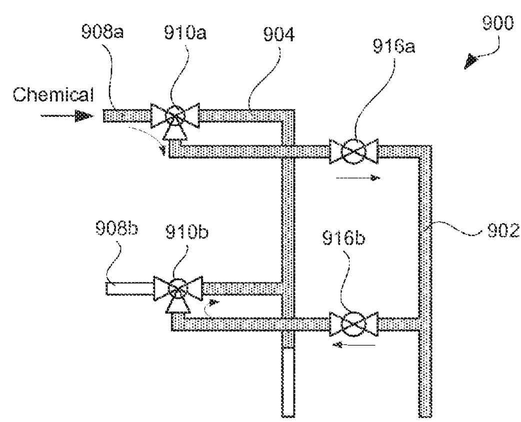

FIG. 9C illustrates dispense panel 900 after it has been primed with the first chemical (i.e., after completing the priming operation), in accordance with some embodiments. It should be noted that the priming may be completed as soon as the chemical passes the dispense valve 916*b*. The flow of chemical into the three-way valve 910*b* and waste manifold is optional, but typically used to ensure complete removal of gas bubbles and other chemicals from the dispense manifold 902. In some embodiments (not shown), the first chemical may not reach three-way valve 910*b* or waste manifold 904.

The flow of the first chemical during the priming operation through valves 910*a*, 916*a*, 910*b*, and 916*b* is shown with arrows in FIGS. 9A-9C. Specifically, the first chemical is flown through dispense valve 916*a* in a direction towards dispense manifold 902. At the same time, the first chemical is flown through the dispense valve 916*b* in a direction away from dispense manifold 902. It should be noted that when additional dispense sets are connected to dispense manifold 902, positions of the valves and flow directions through the valves in these dispense sets are the same as for valves 910*b* and 916*b*.

Returning to FIG. 8, method 800 may proceed with dispensing the first chemical from the dispense manifold during operation 806. Referring to FIGS. 9A-9C, during the dispensing operation, the flow of the first chemical through valves 910*a* and 916*b* is the same as during the priming operation described above. However, dispense valve 916*b* (and any other dispense valves connected to dispense manifold 902, if there are additional dispense sets in the panel) is now closed thereby preventing the first chemical from escaping dispense manifold 902 through this dispense valve 916*b* and precisely controlling the amount of the first chemical dispensed out of dispense manifold 902.

Figure 9D:
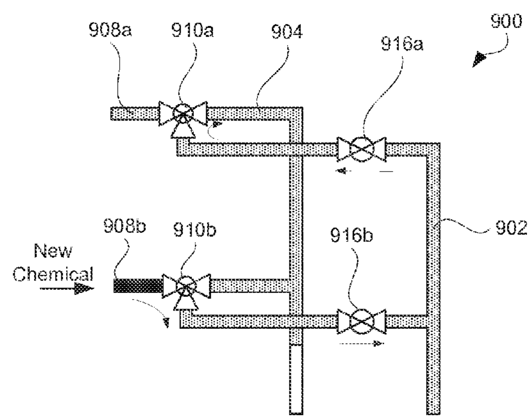
Figure 9E:
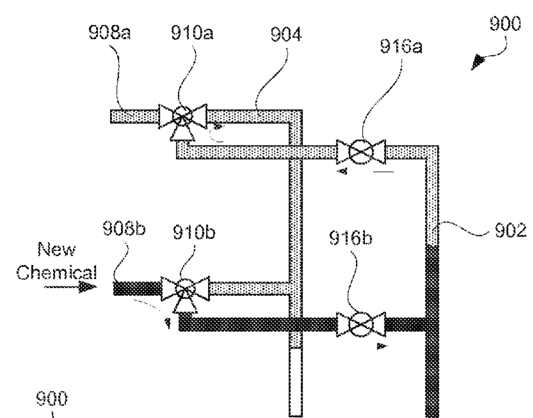
Figure 9F:
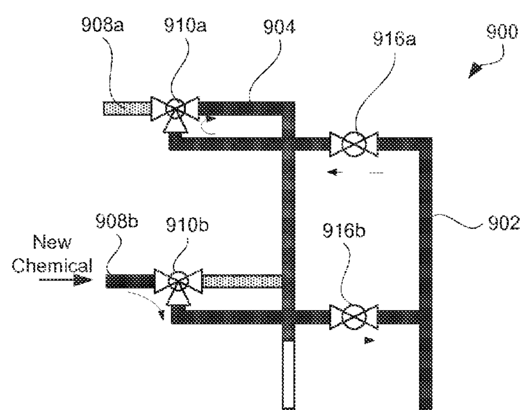

The priming and dispensing operations may be repeated one or more time as reflected by decision block 808 and described in the context of FIGS. 9D-9F. In this example, a new chemical (i.e., the second chemical) is supplied from inlet line 908*b*. FIG. 9D illustrates dispensing panel 900 prior to its being primed with the second chemical. Dispense manifold 902 and some other components of the panel may be filled with the previously dispensed chemical, e.g., the first chemical as described above. One purpose of the new priming operation is to displace this previously dispensed chemical at least from dispense manifold 902. Furthermore, another purpose of this priming operation is to completely fill dispense manifold 902 and these flow channels and valves with the new chemical.

Inlet line 908*b* that supplies the new chemical is connected to three-way valve 910*b*, which now directs the new chemical to dispense valve 916*b*. Dispense valve 916*b* is open and allows the new chemical into dispense manifold 902. FIG. 9E illustrates the dispense panel 900 during the priming operation but before the priming operation is completed. The excess of the new chemical is displaced from dispense manifold 902 through dispense valve 916*a* and may be further directed by the three-way valve 910*a* into the waste manifold. As described above, the priming operation may be stopped as soon as the new chemical passes the dispense valve 916*a*. However, the flow of the new chemical through the dispense valve 916*a* is often continued for a period of time to ensure that no gas bubbles or other chemicals left in dispense manifold 902 as well as in the various flow channels and valves of the dispense panel 900 disposed between the dispense manifold 902 and inlet line 908*b*. The flow directions through the valves 910*a*, 916*a*, 910*b*, and 916*b* during the priming operation are shown in FIG. 9D-F.

During the dispense operation, the valve 916*a* is closed to prevent the new chemical from escaping dispense manifold 902 and thereby providing a controlled dispense of the new liquid out of the dispense manifold 902.

One having ordinary skill in the art would understand the operating principles of dispense panels described above and would be able to scale these principles to panels having three or more dispense valves attached to the same dispense manifold. For example, FIG. 7 illustrates a dispense panel 700 having three inlet lines 708*a*-708*c* capable of supplying chemicals "A", "B" and "C". Positions of the valves during purging and dispensing operations are summarized in the table below.

TABLE

| Mode | Valve 710a | Valve 716a | Valve 710b | Valve 716b | Valve 710c | Valve 716c |
|---|---|---|---|---|---|---|
| Purge with "A" | Supplying | Open | Priming | Open | Priming | Open |
| Dispense "A" | Supplying | Open | Priming | Closed | Priming | Closed |
| Purge with "B" | Priming | Open | Supplying | Open | Priming | Open |

TABLE-continued

| Mode | Valve 710a | Valve 716a | Valve 710b | Valve 716b | Valve 710c | Valve 716c |
|---|---|---|---|---|---|---|
| Dispense "B" | Priming | Closed | Supplying | Open | Priming | Closed |
| Purge with "C" | Priming | Open | Priming | Open | Supplying | Open |
| Dispense "C" | Priming | Closed | Priming | Closed | Supplying | Open |

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of dispensing different chemicals for use in high productivity combinatorial processing, the method comprising:

(a) providing a dispense panel comprising a dispense manifold, a first dispense valve connected to the dispense manifold, and a second dispense valve connected to the dispense manifold, (b) priming the dispense panel with a first chemical, wherein the priming comprises flowing the first chemical through the first dispense valve to the dispense manifold and flowing the first chemical through the second dispense valve from the dispense manifold, and wherein after the priming, the dispense manifold is filled with the first chemical; and (c) dispensing the first chemical from the dispense manifold, wherein the dispensing comprises flowing the first chemical through the first dispense valve to the dispensing manifold while maintaining the second dispense valve closed.

2. The method of claim 1, wherein the dispense panel further comprises a waste manifold for receiving the first chemical from the second dispense valve during the priming the dispense panel with the first chemical.

3. The method of claim 2, wherein the dispense panel further comprises a first three-way valve and a second three-way valve, the first three-way valve being connected to a first inlet, the first dispense valve, and the waste manifold, the first three-way valve being configured to allow a flow either between the first inlet and the first dispense valve or between the first dispense valve and the waste manifold, the second three-way valve being connected to a second inlet, the second dispense valve, and the waste manifold, the second three-way valve being configured to allow a flow either between the second inlet and the second dispense valve or between the waste manifold and the second dispense valve.

4. The method of claim 3, wherein, during the priming the dispense panel with the first chemical, the first three-way valve allows the first chemical to flow from the first inlet to the first dispense valve, while the second three-way allows the first chemical to flow from the second dispense valve into the waste manifold.

5. The method of claim 4, wherein, during the dispensing the first chemical from the dispense manifold, the first three-way valve allows the first chemical to flow from the first inlet to the first dispense valve while the second three-way valve is kept closed.

6. The method of claim 3, further comprising:

(d) priming the dispense panel with a second chemical, wherein the priming comprises flowing the second chemical through the second dispense valve to the dispense manifold and flowing the second chemical through the first dispense valve from the dispense manifold, and wherein after the priming, the dispense manifold is filled with the second chemical and free from the first chemical; and (e) dispensing the second chemical from the dispense manifold, wherein the dispensing comprises flowing the second chemical through the second dispense valve to the dispensing manifold while the first dispense valve is kept closed during the dispensing.

7. The method of claim 6, wherein, during the priming the dispense panel with the second chemical, the second three-way valve allows the second chemical to flow from the second inlet to the second dispense valve, while the first three-way allows the second chemical to flow from the first dispense valve into the waste manifold.

8. The method of claim 7, wherein, during the dispensing the second chemical from the dispense manifold, the second three-way valve allows the second chemical to flow from the second inlet to the second dispense valve, while the first three-way valve is kept closed.

9. The method of claim 6, further comprising repeating (b) and (c) after completing (d) and (e).

10. The method of claim 1, further comprising:

(f) priming the dispense panel with a second chemical, wherein after the priming, the dispense manifold is filled with the second chemical; and (g) dispensing the second chemical from the dispense manifold.

11. The method of claim 10, further comprising repeating (b) and (c) after completing (f) and (g).

12. The method of claim 1, wherein the dispense panel further comprises a third dispense valve connected to the dispense manifold, wherein the priming the dispense panel with the first chemical comprises flowing the first chemical through the third dispense valve from the dispense manifold, while the third dispense valve is kept closed during the dispensing the first chemical from the dispensing manifold.

13. The method of claim 12, further comprising:

(h) priming the dispense panel with a second chemical, wherein the priming comprises flowing the second chemical through the second dispense valve to the dispense manifold, flowing the second chemical through the first dispense valve from the dispense manifold, and flowing the second chemical through the third dispense valve from the dispense manifold and wherein, after the priming, the dispense manifold is filled with the second chemical; and (i) dispensing the second chemical from the dispense manifold, wherein the dispensing comprises flowing the second chemical through the second dispense valve to the dispensing manifold, while the first dispense valve and the third dispense valve are kept closed during the dispensing.

14. The method of claim 13, further comprising:

(j) priming the dispense panel with a third chemical, wherein the priming comprises flowing the third chemical through the third dispense valve to the dispense manifold, flowing the third chemical through the first dispense valve from the dispense manifold, and flowing the third chemical through the second dispense valve from the dispense manifold and wherein after the priming, the dispense manifold is filled with the third chemical; and (k) dispensing the third chemical from the dispense manifold, wherein the dispensing comprises flowing the third chemical through the third dispense valve to the dispensing manifold, and wherein the first dispense valve and the second dispense valve are kept closed during the dispensing.

15. The method of claim 14, further comprising repeating (b)-(c), (h)-(i), or both after completion of (j)-(k).

16. The method of claim 1, wherein the first chemical is one of an inert gas, deionized water, or a processing chemical.

17. The method of claim 1, wherein the first dispense valve is shut for a period of time between (a) and (b).

18. The method of claim 1, wherein, after the priming, the dispense manifold is free from any other previously dispensed chemicals.

19. A method of dispensing two chemicals through one dispense manifold without cross-contaminating either one of the two chemicals, the method comprising:

dispensing a first chemical from the dispense manifold, the dispense manifold being connected to a first dispense valve and to a second dispense valve;

priming the dispense manifold with a second chemical, wherein the priming comprises flowing the second chemical through the second dispense valve in a direction towards the dispense manifold and flowing the second chemical through the first dispense valve in a direction away from the dispense manifold, and wherein after the priming the dispense manifold is filled with the second chemical and free of the first chemical; and dispensing the second chemical from the dispense manifold.

* * * * *